(12) United States Patent
Thompsen et al.

(10) Patent No.: US 7,116,113 B1
(45) Date of Patent: Oct. 3, 2006

(54) SYSTEMS AND METHODS FOR SENSE FET CALIBRATION

(75) Inventors: Brett J. Thompsen, Dallas, TX (US); John H. Carpenter, Jr., Rowlett, TX (US); Amer H. Atrash, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/122,464

(22) Filed: May 4, 2005

(51) Int. Cl.
*G01R 35/00* (2006.01)
(52) U.S. Cl. ...................................... 324/601; 324/769
(58) Field of Classification Search ............. 324/158.1, 324/601, 709
See application file for complete search history.

(56) References Cited

U.S. PATENT DOCUMENTS

2005/0184721 A1* 8/2005 Peterson ................. 324/117 R
2005/0195647 A1* 9/2005 Perner ........................ 365/158

* cited by examiner

*Primary Examiner*—Walter Benson
(74) *Attorney, Agent, or Firm*—William B Kempler; W. James Brady; Frederick J. Telecky, Jr.

(57) ABSTRACT

Systems, methods and circuits for sense circuit calibration. In one particular case, a system is provided that includes a sense circuit, a calibration circuit, and a sample and hold circuit. The sense circuit provides a sense current that is derived from either a reference current or a load current depending upon the operational state. The calibration circuit includes a calibration amplifier electrically coupled to the reference current and to the sense current. The calibration amplifier outputs a calibration signal representing a difference between the reference current and the sense current. The sample and hold circuit is operable to store a value representative of the calibration signal, and useful in forming a calibration offset current applied to the sense current.

17 Claims, 3 Drawing Sheets

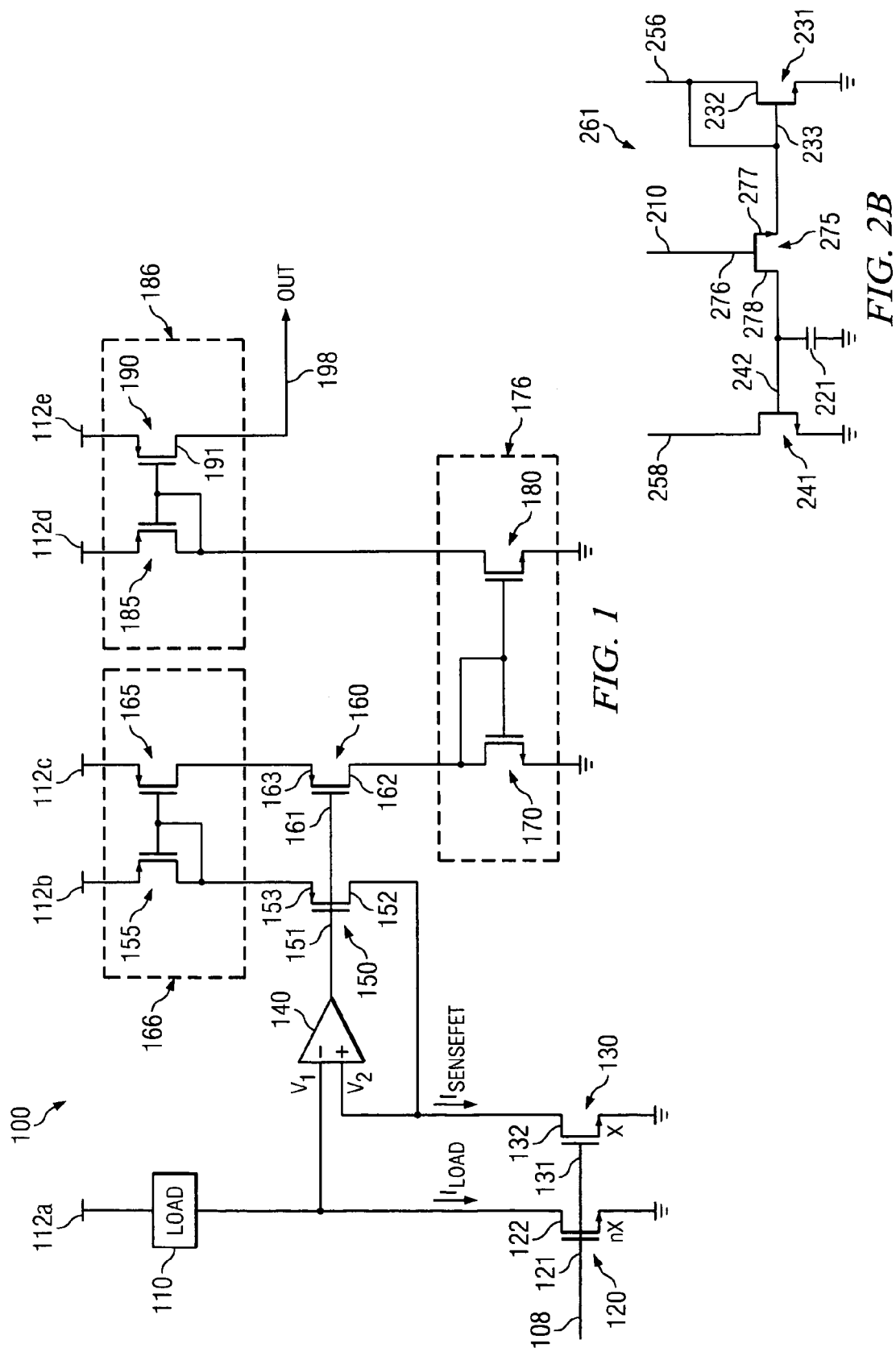

SYSTEMS AND METHODS FOR SENSE FET CALIBRATION

BACKGROUND OF THE INVENTION

The present invention is related to systems and methods for calibrating electrical systems, and in particular to systems and methods for calibrating circuits including a sense FET.

Electrical circuits including amplifiers are susceptible to errors due to, for example, temperature gradients and offset voltages. These errors are often insignificant and therefore ignored. However, in some cases, the output of an electrical circuit must be highly accurate. As such, it is not acceptable to simply ignore the errors.

Where the error cannot be ignored, conventional solutions have applied manual trimming to account for deviations. Such an approach, however, does not account for the various temperature coefficients of the numerous process variations that can cause amplifier offset. Thus, while nominal error is removed, a temperature coefficient error will remain. Further, the trim approach is limited to the step size and range of the trim bits.

Hence, for at least the aforementioned reasons there exists a need in the art for advanced systems and methods for calibrating electric systems.

BRIEF SUMMARY OF THE INVENTION

The present invention is related to systems and methods for calibrating electrical systems, and in particular to systems and methods for calibrating circuits including a sense FET.

Various embodiments of the present invention provide systems for sense FET calibration. The systems include a sense circuit capable of providing a sense current derived from a reference current. In addition, the systems include a calibration circuit with a calibration amplifier and a sample and hold circuit. The calibration amplifier outputs a calibration signal representing a difference between the reference current and the sense current, and the sample and hold circuit is operable to store a value representative of the calibration signal.

The calibration signal represents variations in the sense current introduced by, for example, sense circuit offset error and/or sense circuit temperature coefficient error. A value representative of the calibration signal is stored by the sample and hold circuit when a calibration mode is indicated. In contrast, when a standard operation mode is indicated, the value stored by the sample and hold circuit is maintained substantially constant and used to create a calibration current that is aggregated with the sense current. This results in the reduction or elimination of the aforementioned variations. Where the calibration is periodically performed, compensation for the effects of changing temperature can be achieved such that the sense circuit temperature coefficient error is reduced or eliminated. In one particular case, an output current consisting of the sense current aggregated with the calibration current is used to form a feedback voltage that drives the sense circuit.

In one particular instance of the embodiments, the system further includes a calibration control signal and a load current. The sense circuit includes a multiplexer driving a sense amplifier, and electrically coupled to the calibration control signal. Based on the calibration control signal, the multiplexer provides either the reference current or the load current to the sense amplifier. When the calibration control signal is activated or asserted, the reference current is provided to the sense amplifier, and the sample and hold circuit is continuously updated. Alternatively, when the calibration control signal is deactivated or de-asserted, the load current is provided to the sense amplifier, the value stored by the sample and hold circuit is maintained substantially constant, and a current derived from the value stored in the sample and hold circuit is aggregated with the sense current to form a calibrated current. The calibrated current represents the load current with substantially all of the sense circuit offset error reduced or eliminated. Aggregation of the current derived from the value stored in the sample and hold circuit with the sense current may provide a calibrated current that represents the sense current with a sense circuit temperature coefficient error reduced or eliminated.

Other embodiments of the present invention provide methods for circuit calibration. The methods include providing a reference current to a sense circuit. The sense circuit provides a sense current representing the reference current. A calibration circuit is also provided that compares the sense current and the reference current, and provides a calibration signal representing a difference between the reference current and the sense current. A sample and hold circuit receives the calibration signal and stores a value representative thereof. The method further includes controlling a calibration control signal such that the value stored in the sample and hold circuit is updated and used for calibration. In one instance, when the calibration control signal is asserted or activated, the value stored in the sample and hold circuit is updated. When the calibration signal is de-asserted or deactivated, the value stored in the sample and hold circuit is maintained substantially constant, and a current derived from the value in the sample and hold circuit is aggregated with the sense current to form a calibrated current. This calibrated current is the sense current with a sense circuit offset error and/or a sense circuit temperature coefficient error substantially removed.

Yet other embodiments of the present invention provide circuits for calibration. The circuits include a sense circuit receiving a reference current. The sense circuit derives a sense current from the reference current, and the sense current is provided to a calibration circuit that compares the sense current and the reference current. Based on the comparison, the calibration circuit outputs a calibration signal to a sample and hold circuit, and a value representative of the calibration signal is stored by the sample and hold circuit. The value stored in the sample and hold circuit may then be used for calibration purposes to reduce or eliminate offset errors and temperature errors associated with the sense circuit.

This summary provides only a general outline of some embodiments of the present invention. Many other objects, features, advantages and other embodiments of the present invention will become more fully apparent from the following detailed description, the appended claims and the accompanying drawings.

BRIEF DESCRIPTION OF THE DRAWINGS

In the Figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

FIG. 1 is a sense circuit;

FIG. 2B depicts an exemplary sample and hold circuit that may be used in relation to the calibrating sense circuit of FIG. 2;

DETAILED DESCRIPTION OF THE INVENTION

Figure 2A:
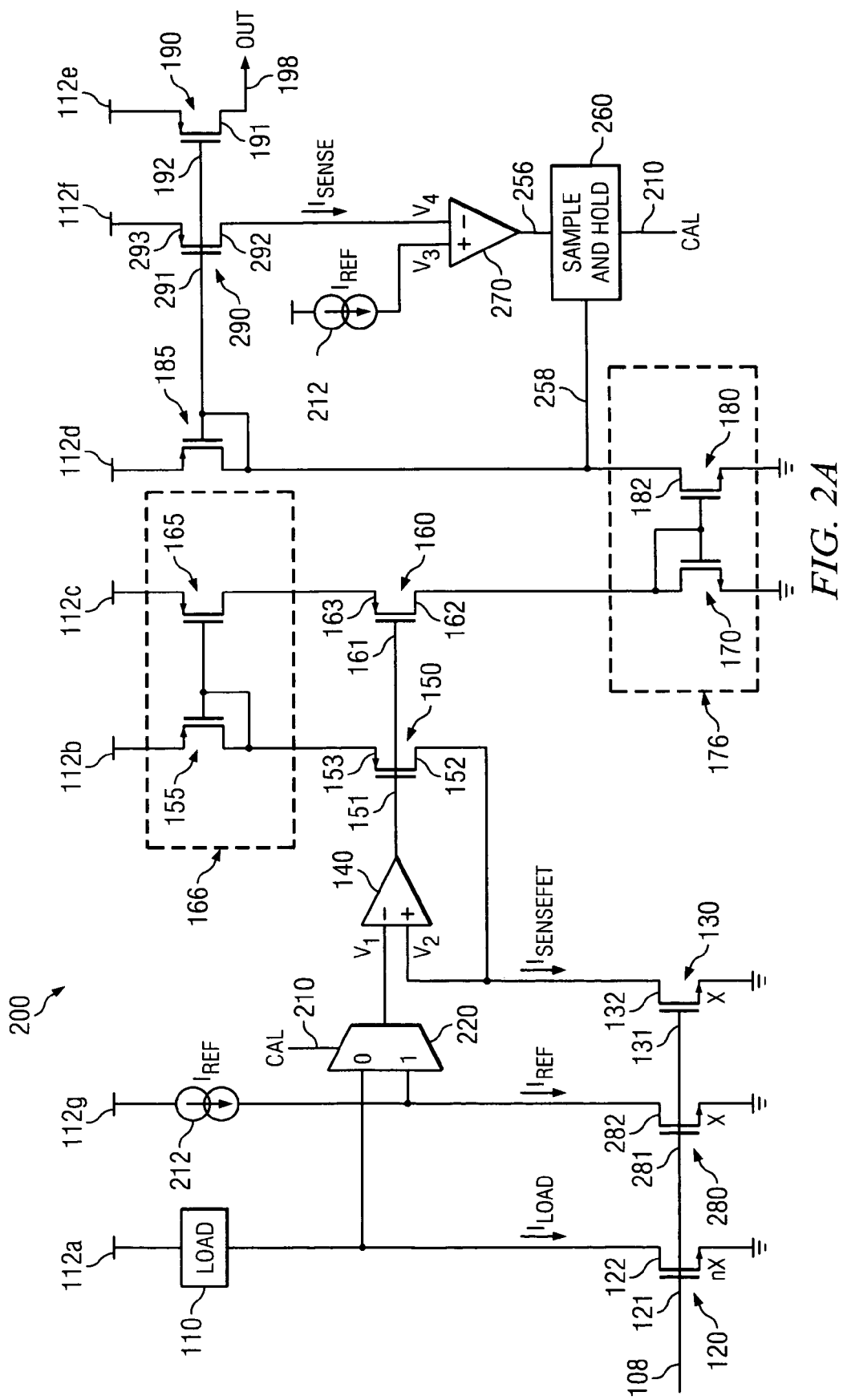
FIG. 2A depicts a calibrating sense circuit in accordance with various embodiments of the present invention.

The present invention is related to systems and methods for calibrating electrical systems, and in particular to systems and methods for calibrating circuits including a sense FET.

Various embodiments of the present invention provide systems, circuits and methods for sense FET calibration. Such embodiments may include a sense circuit capable of providing a sense current derived from or representative of a reference current. In addition, the systems include a calibration circuit with a calibration amplifier and a sample and hold circuit. The calibration amplifier outputs a calibration signal representing a difference between the reference current and the sense current, and the sample and hold circuit is operable to store and use a value representative of the calibration signal to reduce or eliminate variations or errors introduced by the sense circuit. The terms "representative of", "representing", or "derived from" are used in their broadest sense to mean any value related to another value through, for example, some mathematical relationship. Thus, as just one general example, the sense current may be some percentage of the reference current. As another example, the sense current is the reference current plus some offset current.

The calibration signal represents variations in the sense current introduced by, for example, sense circuit offset error and/or sense circuit temperature coefficient error. As used herein, the term "sense circuit offset error" is used in its broadest sense to mean any variation or error introduced due to a voltage or current offset in a sense circuit. Thus, for example, sense circuit offset error may be introduced by an offset associated with a sense FET and/or a sense amplifier that are part of the sense circuit. Similarly, as used herein, the term "sense circuit temperature coefficient error" is used in its broadest sense to mean any variation introduced due to the effects of temperature on the sense circuit. Thus, for example, sense circuit temperature coefficient error may include variations due to various temperature coefficients of the different process variations that can result in amplifier offset. Alternatively, or in addition, sense circuit temperature coefficient error may include variations caused by a change in the temperature of the sense circuit.

A value representative of the calibration signal is stored by the sample and hold circuit when a calibration mode is indicated. This can be done by, for example, electrically coupling a capacitor to the calibration signal such that the capacitor charges to a value representative of the calibration signal. In contrast, when a standard operation mode is indicated, the value stored by the sample and hold circuit is used to create a calibration current that is aggregated with the sense current. This results in the reduction or elimination of, for example, the sense circuit offset error and/or sense circuit temperature coefficient error. Where the calibration is periodically performed, compensation for the effects of changing temperature can be achieved. In one particular case, an output current consisting of the sense current aggregated with the calibration current is used to form a feedback voltage that drives the sense circuit.

It should be noted that, as used herein, the term "electrically coupled" is used in its broadest sense to mean any type of coupling whereby an electrical connection is made between two endpoints. Thus, for example, two devices electrically connected via a wire or other conductive path are electrically coupled. Alternatively, two end devices separated by one or more electrically conductive devices are electrically coupled where there is a signal path capable of passing some electrical current originating at one end device to the other end device. It should be noted that not all current originating at one end device must be received at the other end device for the devices to be considered electrically coupled. Rather, only some portion of the current need pass from one end device to the other end device to be electrically coupled in accordance with the definition use herein.

In accordance with the preceding discussion, various embodiments of the present invention are capable of calibrating to a known reference condition during a calibration mode, and providing error correction during a normal operation mode based on the calibration. Such embodiments utilize an independent amplifier to calibrate for error caused by sense amplifier offset and/or temperature variation. Embodiments of the present invention provide an ability to sense amplifier changes over temperature and signal range, and to compensate for the changes. Since the calibration is performed using known conditions and periodically repeated over various operating conditions, errors such as large temperature coefficients can be reduced or eliminated.

Turning to FIG. 1, a sense circuit 100 is depicted. Sense circuit 100 includes a load FET 120 and a sense FET 130. A gate 121 of load FET 120 and a gate 131 of sense FET 130 electrically coupled to a signal input 108. A drain 122 of load FET 120 is electrically coupled to a negative input of a sense amplifier 140, and to a load 110. Load 110 is electrically coupled to a voltage source 112a. A drain 132 of sense FET 130 is electrically coupled to a source 152 of a FET 150, and to the positive input of sense amplifier 140. As indicated by the "nX" notation and the "X" notation respectively associated with load FET 120 and sense FET 130, load FET 120 is "n" times larger than sense FET 130. Thus, for the purposes of this disclosure, a load current ($I_{load}$) traversing load FET 130 is approximately "n" times as large as a sense current traversing sense FET 130 where the size of other devices in sense circuit are controlled.

The output of sense amplifier 140 drives a gate 151 of FET 150 and a gate 161 of a FET 160. A source 153 of FET 150 and a source 163 of FET 160 are electrically coupled to a current mirror 166 comprised of a FET 155 and a FET 165. A drain 162 of FET 160 is electrically coupled to another current mirror 176 comprised of a FET 170 and a FET 180, and current mirror 176 is electrically coupled to yet another current mirror 186 comprised of a FET 185 and a FET 186. A drain 191 of FET 190 is electrically coupled to an output 198. In operation, sense amplifier 140 acts to force a voltage ($V_1$) at the negative input of sense amplifier 140 to equal a voltage ($V_2$) at the positive input of sense amplifier 140. This results in a current ($I_{senseFET}$) that flows in the feedback loop from source 152 of FET 150, and through sense FET 130. $I_{senseFET}$ corresponds to $I_{load}$ by some mathematical relationship. For example, in one particular case $I_{sense}$ is $I_{load}/n$ plus some offset current ($I_{error}$) due to sense circuit temperature coefficient error and/or sense circuit voltage offset. A current ($I_{out}$) is provided at output 198. $I_{out}$ corresponds by some mathematical relationship to $I_{senseFET}$, and thus corresponds also to $I_{load}$. In one particular case where the size of the FETs in sense circuit 100 are controlled, $I_{out}$ is approximately the same as $I_{senseFET}$. Based on the disclosure provided herein, however, one of ordinary skill in the art will recognize that $I_{out}$ may be some other multiple of $I_{senseFET}$ depending upon the size of the various FETs used in sense circuit 100.

Sense circuit 100 provides $I_{out}$ as a representation of $I_{load}$. $I_{out}$ may be used for one or more purposes as will be appreciated by those of ordinary skill in the art. In particular instances, however, the utility of $I_{out}$ is limited by the accuracy at which $I_{out}$ represents $I_{load}$. As previously discussed, $I_{out}=x(I_{load})+I_{error}$, where $I_{error}$ is the inaccuracy and "x" represents the mathematical relationship between $I_{load}$ and $I_{senseFET}$. Where $I_{load}$ is relatively large, $I_{error}$ is less important and may even be insignificant. However, where $I_{load}$ is reduced, $I_{error}$ becomes more significant. Thus, as more fully described in relation to FIG. 2 below, calibration circuitry may be added to sense circuit 100 that can reduce or eliminate $I_{error}$.

Turning to FIG. 2A, a calibrating sense circuit 200 includes the circuitry of sense circuit 100, and additionally includes a current source 212 providing a reference current ($I_{ref}$) electrically coupled to a drain 282 of a reference FET 280. A gate 281 of reference FET 280 is electrically coupled to gate 121 of load FET 120 and gate 131 of sense FET 130. Current source 212 is also electrically coupled to sense amplifier 140 by way of a multiplexer 220 that is controlled by a calibration control signal 210. Current source 212 in combination with with multiplexer 220 provides an ability to introduce a known current, $I_{ref}$, in place of $I_{load}$. The result of introducing $I_{ref}$ can then be used for calibration.

In addition, a follower FET 290 is added to sense circuit 100 such that a gate 291 of follower FET 290 is electrically coupled to a gate 186 of FET 185 and a gate 192 of FET 190. In this way, a current ($I_{sense}$) is provided from a source 292 of follower FET 290. Similar to that described in relation to sense circuit 100, $I_{sense}$ corresponds to $I_{ref}$ plus $I_{error}$ where current source 212 is driving the negative input of sense amplifier 140. Where follower FET 290 is the same size as FET 185 and FET 190, $I_{sense}$ is approximately the same as $I_{out}$. $I_{sense}$ is electrically coupled to a positive input of a calibration amplifier 270 resulting in a voltage ($V_3$), and $I_{ref}$ is electrically coupled to a negative input of calibration amplifier 270 resulting in a voltage ($V_4$). An output 256 of calibration amplifier 270 equals $I_{error}$. Output 256 of calibration amplifier 270 is electrically coupled to a sample and hold circuit 260, and an output 258 of sample and hold circuit 260 is electrically coupled to a source 182 of FET 180.

In operation, calibration control signal 210 is asserted such that multiplexer 220 causes $I_{ref}$ to be applied to the negative input of sense amplifier 140. Sense amplifier 140 attempts to force $V_1$ and $V_2$ to be equal, which results in $I_{senseFET}$ flowing via sense FET 130. Because the size of sense FET 130 is equivalent to the size of reference FET 280, $I_{senseFET}$ would ideally equal $I_{ref}$. However, as discussed above, sense FET 130 and sense amplifier 140 typically introduce variations into the circuit. These variations result in a relationship between $I_{ref}$ and $I_{senseFET}$ described by the following equation:

$$I_{senseFET}=I_{ref}+I_{error}$$

In some cases, $I_{error}$, or is dominated by the offset of sense amplifier 140 and sense FET 130. This offset is an example of sense circuit offset error as defined above. Offset in sense amplifier 140 is reflected onto the $V_{ds}$ of load FET 120 and sense FET 130. This offset may result in insignificant $I_{error}$ where the $I_{load}$ and $V_{ds}$ are large. However, where $I_{load}$ and $V_{ds}$ are relatively small the signal to offset ratio of sense amplifier 140 is at its lowest, and the offset may result in a significant $I_{error}$. In addition, $I_{error}$ may vary greatly as $V_{ds}$ of sense FET 130 and load FET 120 changes with temperature. This error source is an example of sense circuit temperature coefficient error as defined above. These temperature coefficients are related to, among other things, sense amplifier 140 offsets, load FET 120 $V_{ds}$, sense FET 130 $V_{ds}$, and operating points. Such temperature coefficients are not easily eliminated by trim or other existing means.

Where the size of the various FETS of calibrating sense circuit 200 are controlled, $I_{sense}$ provided from follower FET 290 is equivalent to $I_{senseFET}$ traversing sense FET 130. Thus, the relationship between $I_{sense}$ and $I_{ref}$ is described by the following equation:

$$I_{sense}=I_{ref}+I_{error}$$

$I_{sense}$ is applied to an input of calibration amplifier 270 resulting in a voltage $V_4$, and $I_{ref}$ is applied to the other input of calibration amplifier 270 resulting in a voltage $V_3$. Calibration amplifier 270 attempts to force $V_3$ to equal $V_4$, which results in a calibration signal representative of the difference between $I_{sense}$ and $I_{ref}$. Said another way, calibration amplifier 270 provides output 256 that is representative Of $I_{error}$. Output 256 is provided to sample and hold circuit 260.

Sample and hold circuit 260 may be any circuit that is capable of receiving output 256, and holding a value representative of output 256 when calibrating sense circuit 200 is operating in a calibration mode as indicated by assertion or activation of calibration control signal 210. Thus, when calibration control signal 210 is asserted, sample and hold circuit 260 is continuously updated with a value reflecting output 256 or $I_{error}$. This value can then be used when calibrating sense circuit 200 is switched from calibration mode to a normal operating mode as indicated by de-assertion or deactivation of calibration control signal 210. In particular, a current approximately equal to the magnitude of $I_{error}$ is provided at output 258 of sample and hold circuit 260 as more fully described below. At this point, it should be pointed out that during calibration (i.e, when calibration control signal 210 is asserted), there is a closed loop operation between calibration amplifier 270, sample and hold circuit 260, and the PMOS current mirror comprising FET 185 and FET 290.

When calibration control signal 210 is de-asserted and calibrating sense circuit 200 is returned to normal operation mode, multiplexer 220 causes $I_{load}$ to be applied to the negative input of sense amplifier 140. Again, sense amplifier 140 attempts to force $V_1$ and $V_2$ to be equal, which results in $I_{senseFET}$ representative of $I_{load}$ flowing via sense FET 130. Using the exemplary case set forth above, the relationship of $I_{load}$ to $I_{senseFET}$ is indicated by the following equation:

$$I_{senseFET}=(I_{load}/n)+I_{error}$$

$I_{senseFET}$ is replicated via current mirror 166 and current mirror 176. In addition, the current provided at output 258 by sample and hold circuit 260 is added to $I_{senseFET}$. This aggregated current is provided at output 198 as $I_{out}$. As the current added to $I_{senseFET}$ is approximately equal to $I_{error}$, the current provided as $I_{out}$ is approximately $I_{load}/n$. Said another way, the current provided at output 258 of sample and hold circuit 260 operates to calibrate the current provided at output 198 by reducing or eliminating $I_{error}$ therefrom.

Turning now to FIG. 2B, an exemplary sample and hold circuit 261 is illustrated. Circuit 261 may be used to provide the functionality of sample and hold circuit 260 in accordance with one or more embodiments of the present invention. As will be appreciated by one of ordinary skill in the art based on the disclosure provided herein, various sample and hold circuits may be used. In particular, any circuit may be used that is capable of storing a value representative of the output from calibration amplifier 270 during a calibration mode, and utilizing the value stored during the calibration mode to provide a calibration offset during a normal operation mode.

Exemplary circuit 261 is illustrated in relation to output 258 of sample and hold circuit 260, output 256 of calibration amplifier 270, and calibration control signal 210. Output 256 of calibration amplifier 270 is electrically coupled to a gate 233 and a source 232 of a FET 231. In operation, calibration control signal 210 is electrically coupled to a gate 276 of a control FET 275. When calibration control signal 210 is asserted, control FET 275 acts as a closed switch between a source 278 and a drain 277 effectively applying output 256 of calibration amplifier 270 to a capacitor 221. This causes capacitor 221 to charge or discharge to a value approximately equal to that exhibited on output 256. Once calibration control signal 210 is de-asserted, control FET 275 acts as an open switch between capacitor 221 and output 256 of calibration amplifier 270. At this point, the value stored on capacitor 221 is held constant where the leakage from capacitor 221 is assumed to be insignificant. Capacitor 221 is electrically coupled to a gate 242 of a current FET 241. The value (i.e., voltage) stored on capacitor 221 causes a current to flow via output 258 of sample and hold circuit 260. The current flowing via output 258 is $I_{error}$ as discussed above.

Figure 3:
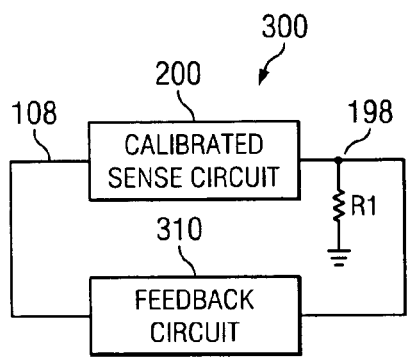
FIG. 3 shows a feedback circuit used in relation to the calibrating sense circuit of FIG. 2, and in accordance with one or more embodiments of the present invention.

Turning to FIG. 3, a feedback system 300 is depicted that shows one use of calibrating sense circuit 200 in accordance with one embodiment of the present invention. As shown, output 198 is applied to a resistor R1. Thus, a voltage equivalent to R1 multiplied by $I_{out}$ is present at output 198. R1 is chosen such that a specified full scale voltage is present when $I_{out}$ is at a desired maximum. The full scale voltage may be, for example, 3.3 V. The voltage is utilized by a feedback circuit 310, and an output of feedback circuit 310 is applied as input 108 to calibrating sense circuit 200. As discussed above, input signal 108 drives gate 121 of load FET 120, gate 281 of reference FET 280, and gate 131 of sense FET 130.

Figure 4A:
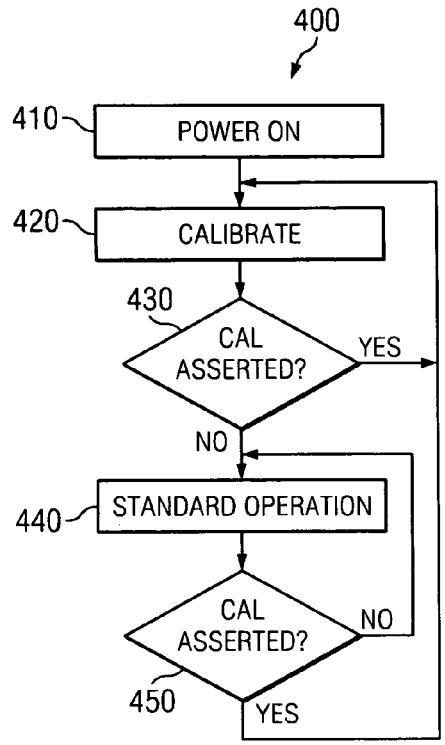
FIG. 4A is a flow diagram describing the operation of the calibrating sense circuit of FIG. 2.

Turning now to FIG. 4, a flow diagram 400 and a timing diagram 450 are used to describe a method of sense circuit operation in accordance with one or more embodiments of the present invention. Following flow diagram 400, power is applied to calibrating sense circuit 200 (block 410) at which time the circuit is placed in the calibration mode (block 420). The circuit may be placed in calibration mode by, for example, setting a latch that drives calibration control signal 210 upon power up. This latch may be associated with a timer that causes the latch to reset. The length of the timer may be selected such that sample and hold circuit 260 can receive and hold a value representative of $I_{error}$. Based on the disclosure provided herein, one of ordinary skill in the art will appreciate that various circuits may be used to place calibrating sense circuit in calibration mode. Further, based on the disclosure provided herein, one of ordinary skill in the art will appreciate that it may not be necessary to place calibrating sense circuit 200 in calibration mode immediately upon power up. Rather, it may be that calibrating sense circuit 200 is powered on for some period sufficient for the circuit to reach a steady operational condition before the calibration mode is selected and the calibration performed.

While calibrating sense circuit 200 is operating in calibration mode (block 420), the value stored by sample and hold circuit 260 is continuously updated to reflect the value provided by calibration amplifier 270. At the same time, calibration control signal 210 is monitored to determine whether calibrating sense circuit 200 is to be maintained in calibration mode (block 430). Where calibration control signal 210 remains asserted (block 430), calibrating sense circuit 200 is maintained in the calibration mode (block 420). Otherwise, where calibration control signal 210 is de-asserted (block 430), calibrating sense circuit is switched to a normal operation mode (block 440).

In one particular embodiment of the present invention, calibration control signal 210 may be a periodic signal causing calibrating sense circuit 200 to toggle periodically from normal operating mode to calibration mode. Thus, calibrating sense circuit 200 may be re-calibrated at a specified period. The period at which calibrating sense circuit 200 is re-calibrated may be selected based on the leakage associated with sample and hold circuit 260, or the amount of time which sample and hold circuit 260 can maintain the value representative of $I_{error}$ without being updated. Further, the period at which calibrating sense circuit 200 is re-calibrated may be selected based on a rate at which the circuit is changing temperature. Thus, for example, where the circuit potentially experiences a substantial change in temperature every thirty seconds, the period may be thirty seconds. Yet further, the period at which calibrated control circuit 200 is re-calibrated may be related to a period which a load circuit receiving an output from calibrating sense circuit 200 can be exposed to the effects of switching calibrating sense circuit into calibration mode. Based on the disclosure provided herein, one of ordinary skill in the art will appreciate a period at which calibrated control circuit 200 may be operated in calibration mode. In addition, one of ordinary skill in the art will appreciate various approaches for switching calibrating sense circuit 200 between normal operation mode and calibration mode, whether the approaches be periodic or otherwise.

Once in normal operational mode, a current corresponding to $I_{error}$ is provided by sample and hold circuit 260. This calibration current is aggregated with the current traversing FET 180 and acts to reduce or eliminate $I_{error}$ from $I_{out}$. In addition, calibration control signal 210 is monitored (block 450). Where calibration control signal 210 remains de-asserted (block 450), calibrating sense circuit 200 remains in normal operational mode (block 440). Otherwise, where calibration control signal 210 is asserted (block 450), calibrating sense circuit 200 is switched to calibration mode where the value representing $I_{error}$ is updated in sample and hold circuit 260.

Figure 4B:
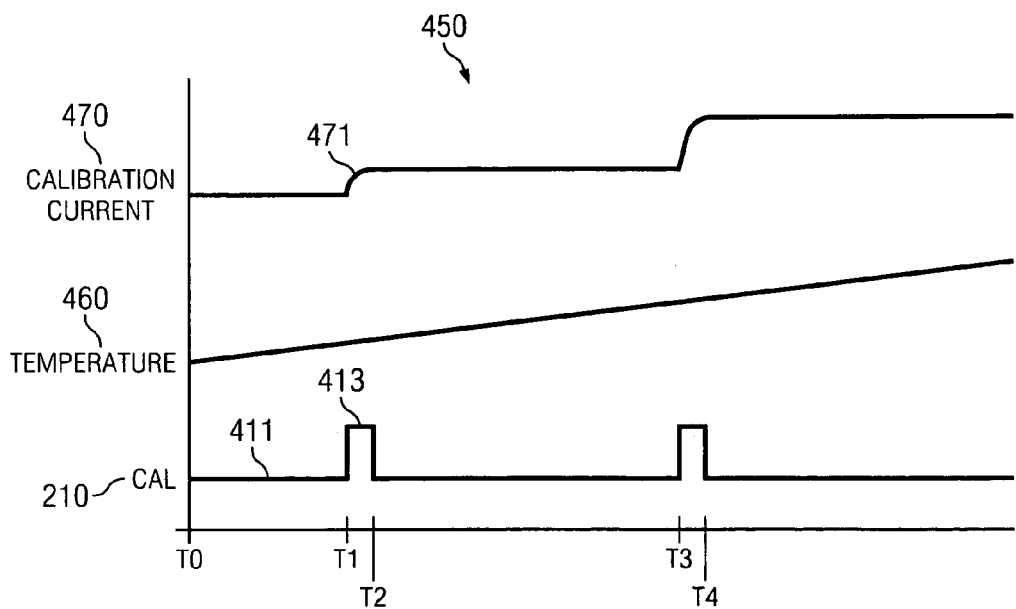
FIG. 4B is a timing diagram describing the operation of the calibrating sense circuit of FIG. 2.

Turning to FIG. 4B, timing diagram 450 illustrates an exemplary operation of calibrating sense circuit 200. In particular, timing diagram 450 illustrates operation of calibrating sense circuit 200 in relation to a calibration current 470 provided by sample and hold circuit 260 to compensate for $I_{error}$, a temperature 460 of calibrating sense circuit 200, and calibration control signal 210. As shown, temperature 460 rises over time as calibrating sense circuit 200 is operated. This results in a change in $I_{error}$ due to sense circuit temperature coefficient error. Calibration control signal 210 is toggled periodically from a de-asserted state 411 to an asserted state 413. During the period from $T_0$ to $T_1$ where calibration control signal 210 is de-asserted, calibration current 470 is substantially constant and driven by the value stored by sample and hold circuit 260. In contrast, during the period from $T_1$ to $T_2$ where calibration control signal 210 is asserted, calibration current 470 increases (as shown by portion 471) as the value stored by sample and hold circuit 260 is continuously updated to reflect $I_{error}$ as it relates to increasing temperature 460. Said another way, the change in temperature 460 is causing an increase in output 256 of calibration amplifier 270 when compared to an earlier calibration. It will be noted by one of ordinary skill in the art that where the value of output 256 decreases when compared to an earlier calibration, calibration current will decrease during the time period from $T_1$ to $T_2$. Once calibration is complete at time $T_2$, calibration control signal 210 is again de-asserted and calibrating sense circuit 200 is returned to normal operation mode for the period between $T_2$ and $T_3$. In normal operation mode, a substantially constant calibration current 470 that compensates for the error detected prior to $T_2$ is output by sample and hold circuit 260. Each time the process is repeated, a compensation current related to temperature 460 is provided. Thus, calibrating sense circuit 200 is recalibrated during a period from $T_3$ to $T_4$, effectively adapting to changes over temperature 460 to reduce or eliminate sense circuit temperature coefficient error. This calibration approach is continuous. As such, it provides calibration that can track changes over time. Thus, the systems, methods and circuits of the present invention provide an advantageous approach to calibration that does not necessarily require trim bits and provides reasonably accurate calibrations.

The invention has now been described in detail for purposes of clarity and understanding. However, it will be appreciated that certain changes and modifications may be practiced within the scope of the appended claims. Thus, although the invention is described with reference to specific embodiments and figures thereof, the embodiments and figures are merely illustrative, and not limiting of the invention. Rather, the scope of the invention is to be determined solely by the appended claims.

What is claimed is:

1. A system for sense FET calibration, the system comprising:
    a reference current;
    a sense circuit, wherein the sense circuit is electrically coupled to the reference current, and wherein the sense circuit provides a sense current derived from the reference current; and
    a calibration circuit, wherein the calibration circuit includes:
    a calibration amplifier electrically coupled to the reference current and to the sense current, wherein the calibration amplifier outputs a calibration signal representing a difference between the reference current and the sense current; and
    a sample and hold circuit, wherein the sample and hold circuit is operable to store a value representative of the calibration signal wherein the sense current includes a sense circuit offset error, and wherein the sense circuit offset error is reflected in the calibration signal.

2. The system of claim 1, wherein the system further comprises:
    a calibration control signal;
    a load current;
    wherein the sense circuit includes a multiplexer driving a sense amplifier, wherein the multiplexer is operable to select between one of the load current and the reference current to drive the sense amplifier based on the calibration control signal; and
    wherein the sample and hold circuit updates based on the calibration control signal.

3. The system of claim 2, wherein upon activation of the calibration control signal:
    the sense amplifier is electrically coupled to the reference current, wherein the sense current is derived from the reference current; and
    the value stored in the sample and hold circuit is continuously updated to reflect the calibration signal.

4. The system of claim 2, wherein upon deactivation of the calibration control signal:
    the sense amplifier is electrically coupled to the load current, wherein the sense current is derived from the load current;
    the value stored in the sample and hold circuit is maintained substantially constant; and
    a current derived from the value stored in the sample and hold circuit is aggregated with the sense current to form a calibrated current, wherein the calibrated current is the sense current with substantially all of the sense circuit offset error removed.

5. The system of claim 1, wherein the sense current further includes a sense circuit temperature coefficient error, and wherein the sense circuit temperature coefficient error is reflected in the calibration signal.

6. The system of claim 5, wherein the system further comprises:
    a calibration control signal;
    a load current;
    wherein the sense circuit includes a multiplexer driving a sense amplifier, wherein the multiplexer is operable to select between one of the load current and the reference current to drive the sense amplifier based on the calibration control signal;
    wherein upon activation of the calibration control signal:
    the sense amplifier is electrically coupled to the reference current, wherein the sense current is derived from the reference current; and
    the value stored in the sample and hold circuit is continuously updated to reflect the calibration signal; and
    wherein upon deactivation of the calibration control signal:
    the sense amplifier is electrically coupled to the load current, wherein the sense current is derived from the load current;
    the value stored in the sample and hold circuit is maintained substantially constant; and
    a current derived from the value stored in the sample and hold circuit is aggregated with the sense current to form a calibrated current, wherein the calibrated current is the sense current with substantially all of the sense circuit temperature coefficient error removed.

7. The system of claim 1, wherein the system further comprises:
    a load current;
    wherein the sense circuit includes a multiplexer driving a sense amplifier, wherein the multiplexer is operable to select between one of the load current and the reference current to drive the sense amplifier based on a calibration control signal;
    wherein the calibration control signal toggles between an active state and an inactive state;

wherein when the calibration control signal is in the active state:
the sense amplifier is electrically coupled to the reference current, wherein the sense current is derived from the reference current; and
the value stored in the sample and hold circuit is updated to reflect the calibration signal; and wherein when the calibration control signal is in the inactive state:
the sense amplifier is electrically coupled to the load current, wherein the sense current is derived from the load current;
the value stored in the sample and hold circuit is maintained substantially constant; and
a current derived from the value stored in the sample and hold circuit is aggregated with the sense current to form a calibrated current, wherein the calibrated current is the sense current with substantially all of the sense circuit offset error and sense circuit temperature coefficient error removed.

8. A method for circuit calibration, the method comprising:
providing a reference current; providing a sense circuit, wherein the sense circuit is electrically coupled to the reference current, and wherein the sense circuit provides a sense current; and
providing a calibration circuit, wherein the calibration circuit includes:
a calibration amplifier electrically coupled to the reference current and to the sense current, wherein the calibration amplifier outputs a calibration signal representing a difference between the reference current and the sense current; and
a sample and hold circuit, wherein the sample and hold circuit is operable to store a value representative of the calibration signal; and
controlling a calibration control signal, wherein the value stored in the sample and hold circuit is updated and used for calibration wherein controlling the calibration control signal includes:
activating the calibration control signal, wherein the value stored in the sample and hold circuit is updated; and
deactivating the calibration control signal, wherein a current derived from the value stored in the sample and hold circuit is aggregated with the sense current to form a calibrated current, and wherein the calibrated current is the sense current with a sense circuit offset error and a sense circuit temperature coefficient error substantially removed.

9. The method of claim 8, wherein the sense circuit includes a multiplexer driving a sense amplifier, wherein the multiplexer is operable to select between one of a load current and the reference current to drive the sense amplifier based on the calibration control signal, wherein the sample and hold circuit updates based on the calibration control signal, and wherein the method further comprises:
activating the calibration control signal, wherein the sense amplifier is electrically coupled to the reference current such that the sense current is derived from the reference current; and wherein the value stored in the sample and hold circuit is updated; and
deactivating the calibration control signal, wherein the sense amplifier is electrically coupled to the load current such that the sense current is derived from the load current, wherein a current derived from the value stored in the sample and hold circuit is aggregated with the sense current to form a calibrated current, and wherein the calibrated current is the sense current with at least a sense circuit offset error substantially removed.

10. The method of claim 8, wherein the sense circuit includes a multiplexer driving a sense amplifier, wherein the multiplexer is operable to select between one of a load current and the reference current to drive the sense amplifier based on the calibration control signal, wherein the sample and hold circuit updates based on the calibration control signal, and wherein the method further comprises:
intermittently toggling the calibration control signal between an active state and an inactive state across a temperature gradient; wherein when the calibration control signal is in the active state:
the sense amplifier is electrically coupled to the reference current, wherein the sense current is derived from the reference current; and
the value stored in the sample and hold circuit is updated to reflect the calibration signal at a sensed point on the temperature gradient; and wherein when the calibration control signal is in the inactive state:
the sense amplifier is electrically coupled to the load current, wherein the sense current is derived from the load current;
the value stored in the sample and hold circuit is maintained substantially constant; and
a current derived from the value stored in the sample and hold circuit is aggregated with the sense current to form a calibrated current, wherein the calibrated current is the sense current with substantially all of sense circuit temperature coefficient error associated with the sensed point on the temperature gradient removed.

11. The method of claim 8, wherein the sense circuit includes a multiplexer driving a sense amplifier, wherein the multiplexer is operable to select between one of a load current and the reference current to drive the sense amplifier based on the calibration control signal, wherein the sample and hold circuit updates based on the calibration control signal, and wherein the method further comprises:
activating the calibration control signal, wherein the sense amplifier is electrically coupled to the reference current such that the sense current is derived from the reference current; and wherein the value stored in the sample and hold circuit is updated; and
deactivating the calibration control signal, wherein the sense amplifier is electrically coupled to the load current such that the sense current is derived from the load current, wherein a current derived from the value stored in the sample and hold circuit is aggregated with the sense current to form a calibrated current, and wherein the calibrated current is the sense current with at least a sense circuit temperature coefficient error substantially removed.

12. A circuit for calibration, the circuit comprising:
a reference current;
a sense circuit, wherein the sense circuit is electrically coupled to the reference current, wherein the sense circuit includes a sense operational amplifier that provides a sense current;
a calibration circuit, wherein the calibration circuit includes:
a calibration operational amplifier coupled to a derivative of the reference current and to the sense current, wherein the calibration operational amplifier outputs a calibration signal representing a difference between the derivative of the reference current and the sense current; and a sample and hold circuit, wherein the sample and hold circuit is operable to store a value representative of the calibration signal wherein the circuit further comprises:
a sense FET electrically coupled to a feedback loop of the sense operational amplifier, and having a first aspect; and
a calibration FET electrically coupled to the reference current, and having a second aspect; and wherein a ratio of the derivative of the reference current to the sense current is the same as a ratio between the second aspect and the first aspect.

13. The circuit of claim 12, the circuit further comprising:
a calibration control signal;
a load current, wherein the load current is electrically coupled to the sense circuit;
wherein the sense circuit includes a multiplexer driving the sense operational amplifier,
wherein the multiplexer is operable to select between one of the load current and the reference current to drive the sense operational amplifier based on the calibration control signal; and
wherein the sample and hold circuit updates based on the calibration control signal.

14. The circuit of claim 13, wherein upon activation of the calibration control signal:
a negative input of the sense operational amplifier is electrically coupled to the reference current, wherein the sense current is derived from the reference current; and
the value stored in the sample and hold circuit is continuously updated to reflect the calibration signal.

15. The circuit of claim 14, wherein upon deactivation of the calibration control signal:
the negative input of the sense operational amplifier is electrically coupled to the load current, wherein the sense current is derived from the load current;
the value stored in the sample and hold circuit is maintained substantially constant; and
a current derived from the value stored in the sample and hold circuit is aggregated with the sense current to form a calibrated current, wherein the calibrated current is the sense current with substantially all of a sense circuit offset error removed.

16. The circuit of claim 13, wherein the circuit further comprises a sample switch, wherein the sample switch is controlled by the calibration control signal, and wherein the sample switch is operable to couple and decouple the calibration signal to/from the sample and hold circuit.

17. The circuit of claim 12, the circuit further comprising:
a load current;
wherein the sense circuit includes a multiplexer driving a sense amplifier, wherein the multiplexer is operable to select between one of the load current and the reference current that drives the sense amplifier based on a calibration control signal;
wherein the calibration control signal toggles between an active state and an inactive state;
wherein when the calibration control signal is in the active state:
the sense amplifier is electrically coupled to the reference current, wherein the sense current is derived from the reference current; and
the value stored in the sample and hold circuit is updated to reflect the calibration signal; and
wherein when the calibration control signal is in the inactive state:
the sense amplifier is electrically coupled to the load current, wherein the sense current is derived from the load current;
the value stored in the sample and hold circuit is maintained substantially constant; and
a current derived from the value stored in the sample and hold circuit is aggregated with the sense current to form a calibrated current, wherein the calibrated current is the sense current with substantially all of a sense circuit offset error and a sense circuit temperature coefficient error removed.

* * * * *